(12) United States Patent
Liu et al.

(10) Patent No.: US 11,532,991 B2
(45) Date of Patent: Dec. 20, 2022

(54) FLYBACK CONVERTER WITH AUXILIARY WINDING VOLTAGE SENSING REFERRING TO CAPACITOR VOLTAGE

(71) Applicant: DIALOG SEMICONDUCTOR INC., Campbell, CA (US)

(72) Inventors: Wenduo Liu, Campbell, CA (US); Heng Yun, Campbell, CA (US)

(73) Assignee: Dialog Semiconductor Inc., Campbell, CA (US)

(*) Notice: Subject to any disclaimer, the term of this patent is extended or adjusted under 35 U.S.C. 154(b) by 0 days.

(21) Appl. No.: 17/142,167

(22) Filed: Jan. 5, 2021

(65) Prior Publication Data
US 2022/0216798 A1 Jul. 7, 2022

(51) Int. Cl.
*H02M 3/335* (2006.01)
*G01R 1/20* (2006.01)
*H02M 1/00* (2006.01)

(52) U.S. Cl.
CPC ... *H02M 3/33592* (2013.01); *H02M 3/33507* (2013.01); *G01R 1/203* (2013.01); *H02M 1/0025* (2021.05)

(58) Field of Classification Search
CPC .......... H02M 3/33507; H02M 1/0025; H02M 3/33523
See application file for complete search history.

(56) References Cited

U.S. PATENT DOCUMENTS

| | | | |
|---|---|---|---|
| 10,483,861 B1* | 11/2019 | Feng | H02M 3/33523 |
| 10,804,805 B1* | 10/2020 | Radic | H02M 3/33523 |
| 2009/0073725 A1* | 3/2009 | Lin | H02M 3/33523 363/19 |
| 2010/0027300 A1* | 2/2010 | Fang | H02M 3/33507 363/21.16 |
| 2011/0149615 A1* | 6/2011 | Matthews | H02M 3/33507 363/21.12 |
| 2018/0034378 A1* | 2/2018 | Lin | H02M 1/08 |

* cited by examiner

*Primary Examiner* — Alex Torres-Rivera
(74) *Attorney, Agent, or Firm* — Haynes and Boone, LLP

(57) ABSTRACT

An auxiliary winding for a flyback converter includes a floating terminal coupled to ground through a diode. A primary-side controller has a power supply voltage terminal coupled to a remaining terminal of the auxiliary winding and has a voltage sense terminal coupled to the floating terminal.

16 Claims, 7 Drawing Sheets

FLYBACK CONVERTER WITH AUXILIARY WINDING VOLTAGE SENSING REFERRING TO CAPACITOR VOLTAGE

TECHNICAL FIELD

This application relates to flyback converters, and more particularly to a flyback converter with auxiliary winding voltage sensing referring to capacitor voltage.

BACKGROUND

As known in the flyback arts, an auxiliary winding voltage may be used to develop a power supply voltage (VCC) for the primary-side controller (MOSFET). In addition, the primary-side controller may sense the auxiliary winding voltage to determine operating conditions such as the output voltage. A conventional flyback converter 100 is shown in FIG. 1 that includes an auxiliary winding (AUX) for a transformer T having a primary winding W1 and a secondary winding W2. During operation, a primary-side controller U1 controls the switching of a power switch transistor M1 connected to the primary winding W1. The primary winding W1 also connects to an input voltage rail. A diode bridge rectifies an AC voltage from an AC mains to produce a rectified input voltage carried on the input voltage rail and supported by a input capacitor Cin.

When the power switch transistor M1 is cycled on, a primary winding current begins to flow through the primary winding W1 as energized from the input voltage. The primary winding current passes through the power switch transistor M1 into ground. The primary-side controller U1 may sense the primary winding current though an Isense terminal coupled to a sense resistor Rs that connects between the power switch transistor M1 and ground. Once a desired peak winding current has been reached, the primary-side controller U1 may then cycle off the power switch transistor M1.

A secondary-side controller U2 controls a synchronous rectifier (SR) switch transistor that couples between a return output terminal and the secondary winding W2 in response to monitoring a drain-to-source voltage (Vds) across the SR switch transistor. Based upon the drain-to-source voltage Vds, the SR controller detects whether the power switch transistor M1 has cycled off so that the SR switch transistor may be switched on to allow the secondary winding current to flow and charge an output voltage Vout that is supported by an output capacitor Cout.

The auxiliary winding has a terminal A that couples to a VCC terminal of the primary-side controller U1 through a diode D1. A power supply capacitor (CVCC) supports the power supply voltage VCC that develops at the VCC terminal. The primary-side controller U1 has a Vsense terminal that senses the terminal A voltage through a voltage divider formed by a resistor R1 and a resistor R2. Although this configuration for the auxiliary winding is conventional, some operating issues occur due to the transformer winding polarity as indicated through the dot convention. In particular, terminal A is homonymous with a terminal D of the primary winding W1 that connects to a drain of the power switch transistor M1. Terminal A of the auxiliary winding is also homonymous with an output terminal of the secondary winding. A terminal C of the auxiliary winding is grounded. A terminal S of the secondary winding connects to a drain of the SR switch transistor.

Given these transformer winding polarities and terminal designations, some operating waveforms during a discontinuous conduction mode of operation are shown in FIG. 2 for flyback converter 100. The terminal C voltage of the auxiliary winding is always grounded. A power switch on-time occurs from a time t0 to a time t1 during which the gate voltage of the power switch transistor (Main switch gate) is asserted to switch on the power switch transistor. Terminal D of the primary winding is thus grounded from time t0 to time t1. After the power switch transistor M1 is cycled off at time t1, the terminal D voltage of the primary winding is asserted high and gradually declines until the secondary winding current stops flowing at a transformer reset time trst. The terminal D voltage equals a sum of the input voltage Vin and a product of Nps times the output voltage Vout at the transformer reset time, where Nps is the primary-winding-to-secondary-winding turns ratio. The terminal D voltage then begins to resonantly oscillate (for this discontinuous conduction scenario) to decline to the input voltage before the next switching cycle begins during a power switch on-time from a time t2 to a time t3.

Prior to time t0, a voltage of the terminal A of the auxiliary winding was grounded as there is no voltage impressed across the auxiliary winding. Since terminal A is homonymous with terminal D, the terminal A voltage equals the input voltage Vin divided by –Npa during the switch on-time from time t0 to time t1, where Npa is the primary-winding-to-auxiliary-winding turns ratio. At time t1, the terminal A voltage is asserted high and beings to gradually decline until it equals a product of the output voltage and Nas at the transformer reset time, where Nas is the auxiliary-winding-to-secondary-winding turns ratio. The terminal A voltage then begins to resonantly oscillate and declines to ground before the next switching cycle begins at time t2.

A voltage of the terminal S of the secondary winding W2 equals the output voltage Vout prior to time t0 (there being no voltage across the secondary winding W2 at that time) and is then asserted to equal the sum of Vin/Nps and the output voltage Vout during the switch on-time from time t0 to time t1. While the secondary winding current flows from time t1 to the transformer reset time, the terminal S voltage is grounded (in an ideal case in which the on-resistance of the SR switch transistor is zero Ω). The Vsense pin or terminal voltage of the primary-side controller U1 is grounded prior to time t0 and is then clamped at approximately –0.7 V by the diode D1 during the on-time period between time t0 and time t1. At time t1, the Vsense voltage is asserted high so that it equals a product of Vout, Nas, and a proportionality constant k at the transformer reset time.

Terminal C of the auxiliary winding is tied to ground and is thus not floating. In contrast, terminal A is floating. Similarly, terminal S of the auxiliary winding is floating. The A and S terminal voltage waveforms have similar shapes but are 180 degrees out of phase with each other. A significant voltage difference thus develops between floating terminals A and S, particularly during the on-time period from time t0 to time t1. When the terminal A voltage increases, the terminal S voltage decreases. Conversely, when the terminal S voltage increases, the terminal A voltage decreases. This changing voltage polarity between the A and S terminals excites an undesirable common-mode current that flows across a parasitic capacitance between the auxiliary winding and the secondary winding W2 and causes electromagnetic interference (EMI) noise issues.

Accordingly, there is a need in the art for flyback converters with reduced EMI issues with respect to the coupling between the auxiliary and secondary windings.

SUMMARY

In accordance with a first aspect of the disclosure, a flyback converter is provided that includes: a transformer including a primary winding, a secondary winding, and an auxiliary winding, the auxiliary winding having a first terminal and having a second terminal coupled to ground through a diode; and a primary-side controller having a power supply voltage terminal coupled to the first terminal of the auxiliary winding and having a voltage sensing terminal coupled to the second terminal of the auxiliary winding.

In accordance with a second aspect of the disclosure, a method of operation for a flyback converter is provided that includes: through a first terminal of a primary-side controller coupled to a first terminal of an auxiliary winding, receiving a power supply voltage; through a second terminal of the primary-side controller, sensing a voltage of a second terminal of the auxiliary winding; and sensing an input voltage for the flyback converter from the sensing of the voltage of the second terminal of the auxiliary winding.

In accordance with a third aspect of the disclosure, a primary-side controller for a flyback converter is provided that includes: a power supply voltage terminal configured to receive a power supply voltage from a first terminal of an auxiliary winding; a voltage sense terminal configured to receive an input current from a second terminal of the auxiliary winding; a voltage generator configured to generate a first voltage from the input current; a voltage processor configured to detect a DC offset voltage of the first voltage; and an amplifier configured to amplify a difference between the first voltage and the DC offset to produce a sensed voltage that is proportional to a voltage of the second terminal of the auxiliary winding.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 3:
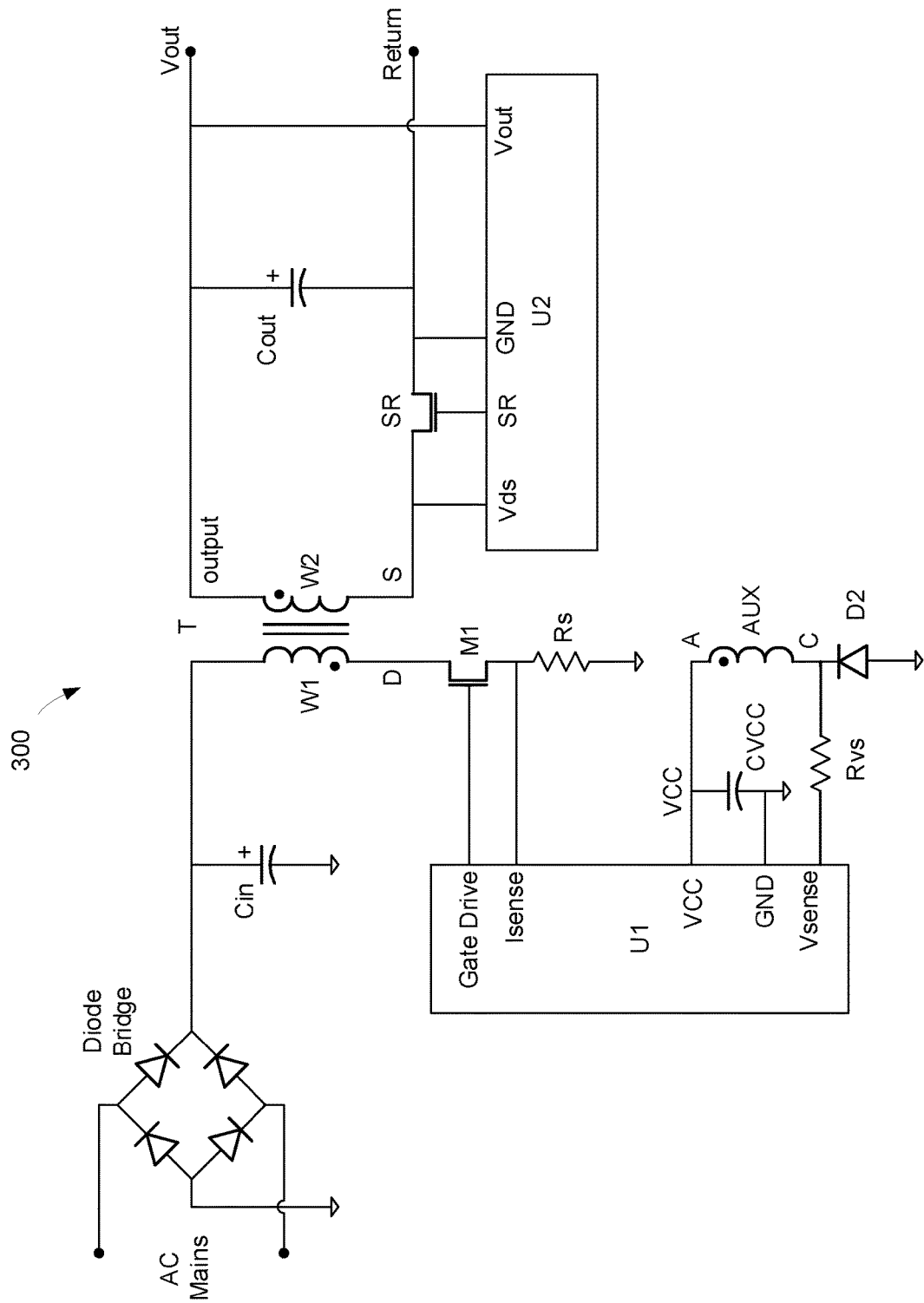
FIG. 3 illustrates a flyback converter with an improved transformer structure for reduced EMI in accordance with an aspect of the disclosure.

To reduce the EMI that results from conventional transformer architectures, a flyback winding with an improved auxiliary winding architecture is provided. An example flyback converter 300 is shown in FIG. 3. As discussed with regard to flyback converter 100, flyback converter 300 includes an auxiliary winding (AUX) for a transformer T having a primary winding W1 and a secondary winding W2. During operation, a primary-side controller U1 controls the switching of a power switch transistor M1 connected to the primary winding W1. The primary winding W1 also connects to an input voltage rail. A diode bridge rectifies an AC voltage from an AC mains to produce a rectified input voltage carried on the input voltage rail and supported by a input capacitor Cin.

When the power switch transistor M1 is cycled on, a primary winding current begins to flow through the primary winding W1 and the power switch transistor M1 into ground. The primary-side controller U1 may sense the primary winding current through an Isense terminal connected to a sense resistor Rs that connects between the power switch transistor M1 and ground. Once a desired peak winding current has been reached, the primary-side controller U1 may then cycle off the power switch transistor M1. As used herein, "connected" refers to a direct electrical connection such as through a conducting lead whereas "coupled" refers to an electrical connection in which the connection may be through an intervening element such as a resistor or a diode.

A secondary-side controller U2 controls a synchronous rectifier (SR) switch transistor that couples between a return output terminal and the secondary winding W2 in response to monitoring a drain-to-source voltage (Vds) across the SR switch transistor. Based upon the drain-to-source voltage Vds, the SR controller detects whether the power switch transistor M1 has cycled off so that the SR switch transistor may be switched on to allow the secondary winding current to flow and charge an output voltage Vout that is supported by an output capacitor Cout.

In contrast to flyback converter 100, there is no diode intervening between the terminal A of the auxiliary winding in improved flyback converter 300 and a VCC terminal of the primary-side controller U1. A power supply capacitor (CVCC) supports the power supply voltage VCC that develops at the VCC terminal. In further contrast to flyback converter 100, the primary-side controller U1 in improved flyback converter 300 has a Vsense terminal that senses the terminal C voltage of the auxiliary winding. For example, the Vsense terminal of the primary-side controller U1 may couple to terminal C of the auxiliary winding through a resistor Rvs. A cathode of a diode D2 connects to terminal C. An anode of diode D2 connects to ground. Terminal A of the auxiliary winding remains homonymous with terminal D of the primary winding W1. Similarly, terminal A remains homonymous with the output terminal of the secondary winding W2. But note that floating and non-floating relationships of terminals A and C are reversed in improved flyback converter 300 as compared to flyback converter 100. In particular, terminal C is now floating whereas terminal A is non-floating.

Figure 4:
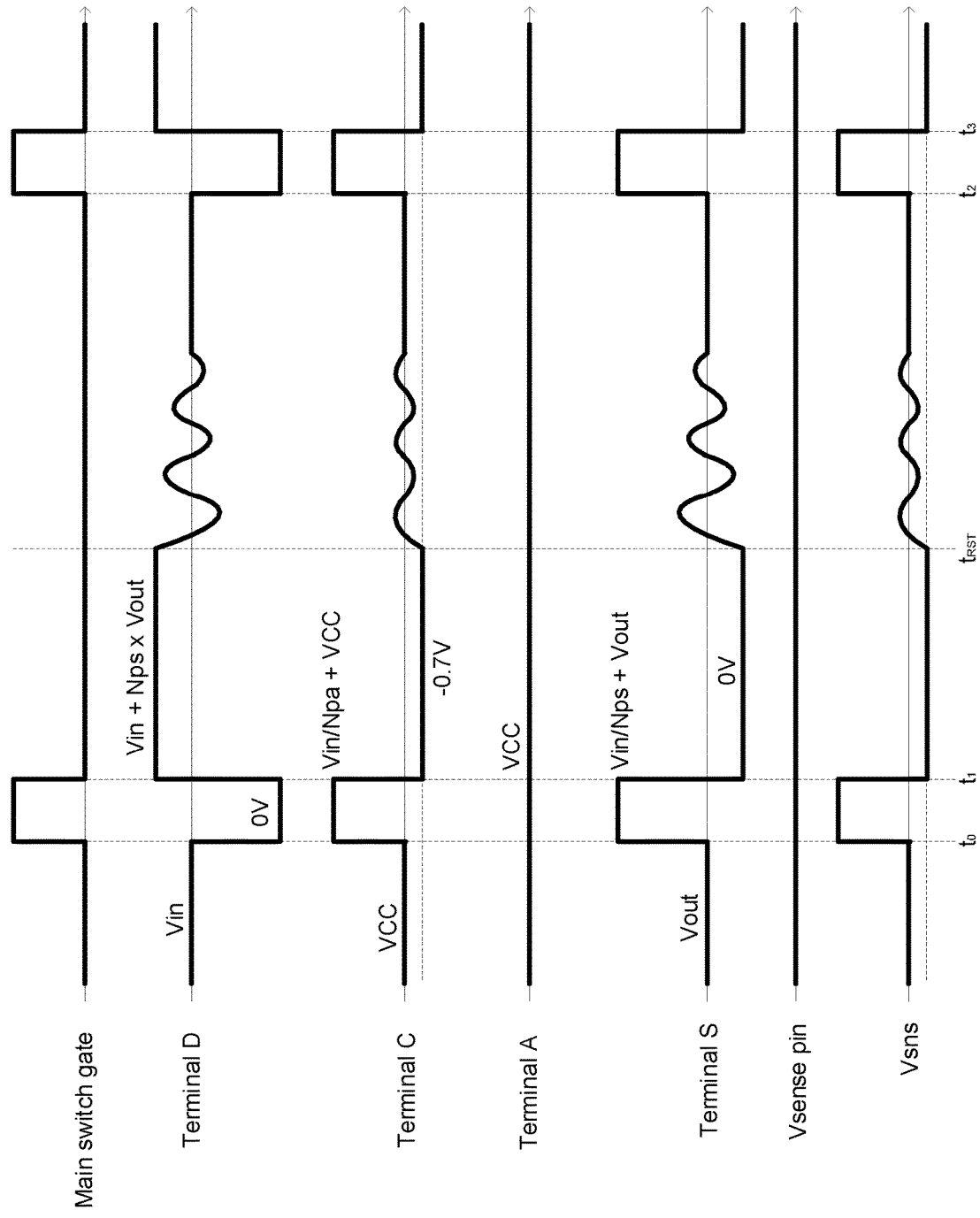
FIG. 4 illustrates some voltage waveforms for the flyback converter of FIG. 3 during a discontinuous conduction mode of operation in accordance with an aspect of the disclosure.

Some voltage waveforms for flyback converter 300 are shown in FIG. 4 for a discontinuous conduction mode of operation. The terminal D voltage waveform is as discussed previously. During the power switch on-time from a time t0 to a time t1, the gate voltage of the power switch transistor (Main switch gate) is asserted to switch on the power switch transistor M1. Terminal D of the primary winding is thus grounded during the power switch on-time period. After the power switch transistor M1 is cycled off at time t1, the terminal D voltage is asserted high and gradually declines until the secondary winding current stops flowing at a transformer reset time trst. The terminal D voltage equals a sum of the input voltage Vin and a product of Nps times the output voltage Vout at the transformer reset time, where Nps is the primary-winding-to-secondary-winding turns ratio. The terminal D voltage then begins to resonantly oscillate to decline to the input voltage before the next switching cycle begins during a power switch on-time from a time t2 to a time t3.

Figure 1:
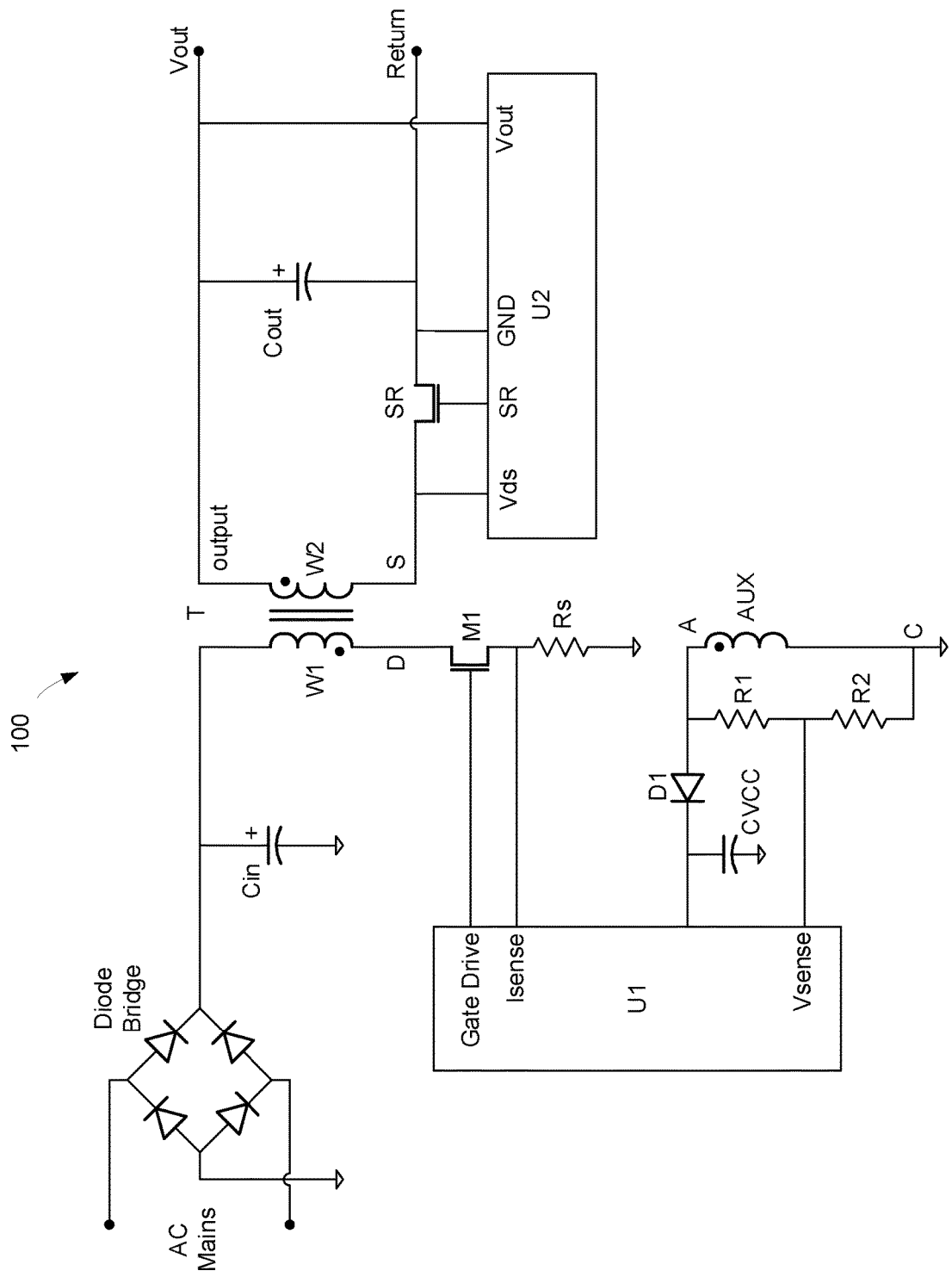
FIG. 1 illustrates a conventional flyback converter.
Figure 2:
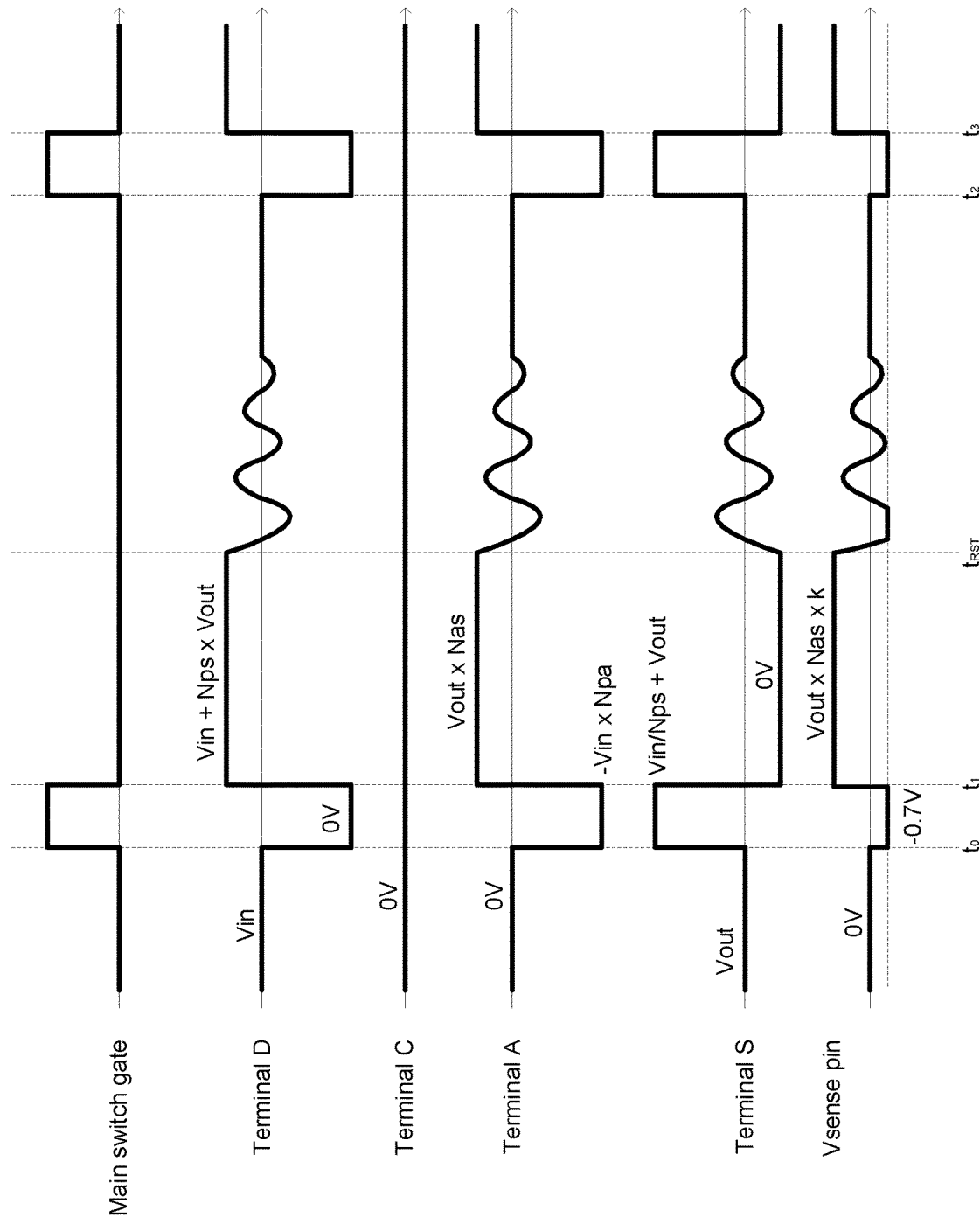
FIG. 2 illustrates some voltage waveforms for the flyback converter of FIG. 1 during a discontinuous conduction mode of operation.

As noted earlier, the terminal A voltage in flyback converter 300 is no longer floating. Instead, the terminal A voltage equals the power supply voltage VCC across the power switch cycles. The power supply voltage VCC is stored by the power supply capacitor CVCC and functions as the power supply voltage for the primary-side controller U1. The floating terminal S voltage waveform remains as discussed for FIG. 2. The terminal S voltage of the secondary winding W2 thus equals the output voltage Vout prior to time t0 and is then asserted to equal the sum of Vin/Nps with the output voltage Vout during the power switch on-time period from time t0 to time t1. While the secondary winding current flows from time t1 to the transformer reset time, the terminal S voltage is grounded. After the transformer reset time (trst), the terminal S voltage resonantly oscillates until it declines to its default value of Vout.

Terminal C is no longer grounded but instead is the floating terminal for the auxiliary winding. Prior to the power switch on-time period beginning at time t0, the terminal C voltage equals the power supply voltage VCC but is then asserted high at time t0 to equal a sum of Vin/Npa and the power supply voltage VCC, where Vin is the input voltage and Npa is the primary-winding-to-auxiliary-winding turns ratio. After the power switch transistor M1 cycles off at time t2 and the secondary winding current gradually declines until it is exhausted at the transformer reset time, the terminal C voltage is clamped at approximately −0.7V below ground by the diode D2. Following the transformer reset time, the terminal C voltage resonantly oscillates until it subsides to the power supply voltage VCC.

As shown in FIG. 4, when the terminal C voltage increases, the terminal S voltage similarly increases. Conversely, when the terminal C voltage decreases, the terminal S voltage decreases. With the proper winding design, the slew rate for the terminal C voltage and the slew rate for the terminal S voltage may be substantially similar such that there is zero voltage across the parasitic capacitance between these two terminals. There is thus a significant impedance between the primary and secondary sides of the transformer that blocks common mode noise and thus advantageously reduces EMI.

Figure 5:
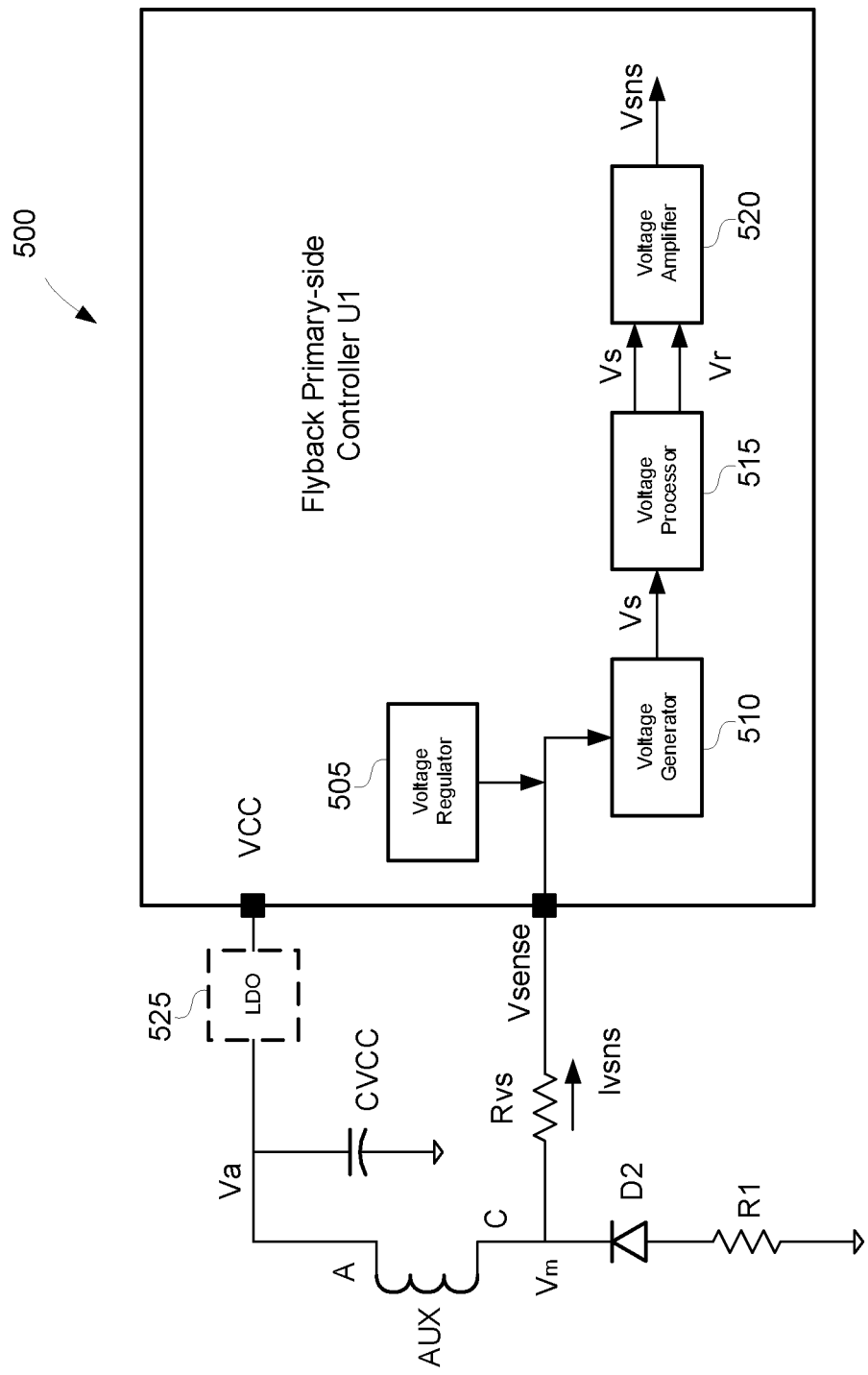
FIG. 5 illustrates an embodiment for the primary-side controller in the flyback converter of FIG. 3 in which the Vsense terminal voltage is regulated in accordance with an aspect of the disclosure.

Turning now to FIG. 5, a portion 500 of flyback converter 300 is shown in more detail that includes the auxiliary winding and the primary-side controller U1. The cathode of diode D2 couples to ground through a resistor R1. It will be appreciated that a similar resistor is not shown for illustration clarity in FIG. 3. An optional linear drop out (LDO) regulator 525 may be used to regulate the power supply voltage VCC that is supplied to the primary-side controller U1. In such embodiments, the voltage across the power supply voltage CVCC capacitor may be designated as Va, which acts as an input voltage to LDO 525 to produce the power supply voltage VCC. In other embodiments, LDO 525 may be eliminated such that Va and power supply voltage VCC would be the same. The terminal C voltage of the auxiliary winding is designated as Vm in FIG. 5. In some embodiments, primary-side controller U1 includes a voltage regulator 505 that regulates its Vsense pin or terminal voltage to equal a constant value (e.g., some fraction of VCC). The difference between the Vm voltage and the Vsense voltage across the resistor Rvs develops an input current Ivsns that conducts from the C terminal of the auxiliary winding through the resistor Rvs and into the Vsense terminal of the primary-side controller U1. In particular, the input current Ivsns equals the ratio (Vm−Vsense)/Rvs.

The voltage across the auxiliary winding is equal to the difference between the Va and Vm voltages. The Va voltage (which may be equal to the power supply voltage VCC in embodiments in which LDO 525 is absent) is constant whereas the Vm voltage varies across the power switch cycle. The auxiliary winding may be regarded to function as an inductor that is subject to the volt-second balance principle. Thus, the Va voltage may be deemed to form the DC offset for the Vm voltage. To sense the Vm voltage, primary-side controller U1 includes a voltage generator 510 that generates a voltage Vs responsive to the input current Ivsns. The voltage Vs is proportional to Vm but with a smaller amplitude and a different DC offset voltage Vr. A voltage processor 515 detects the DC offset Vr so that an amplifier 520 may amplify the difference (Vs−Vr) to produce a sensed voltage Vsns that is proportional to the absolute value of the difference (Vm−Va). The DC offset of the sensed voltage Vsns is zero. In some embodiments, amplifier 520 may be a differentiator amplifier.

Referring again to FIG. 4, the Vsense pin voltage is thus constant across the power switch cycle due to the voltage regulation from voltage regulator 505 (FIG. 5). The sensed voltage Vsns is asserted high during the power switch on-time from time t0 to time t1. During this power switch on-time, the sensed voltage Vsns is proportional to the input voltage Vin such that Vsns equals a product of a proportionality constant K1 and Vin during the power switch on-time. At the transformer reset time, it can be shown that the sensed voltage Vsns equals a product of a proportionality constant K2 and the output voltage Vout. The primary-side controller may thus sense both the input voltage Vin and the output voltage Vout through the production of the sensed voltage Vsns. The proportionality constants K1 and K2 depend upon Rvs, the transformer turns ratio, the gain of the voltage generator 510, and the gain of amplifier 520. If these gains are fixed, the proportionality constants K1 and K2 may be configured through an appropriate value of Rvs.

Figure 6:
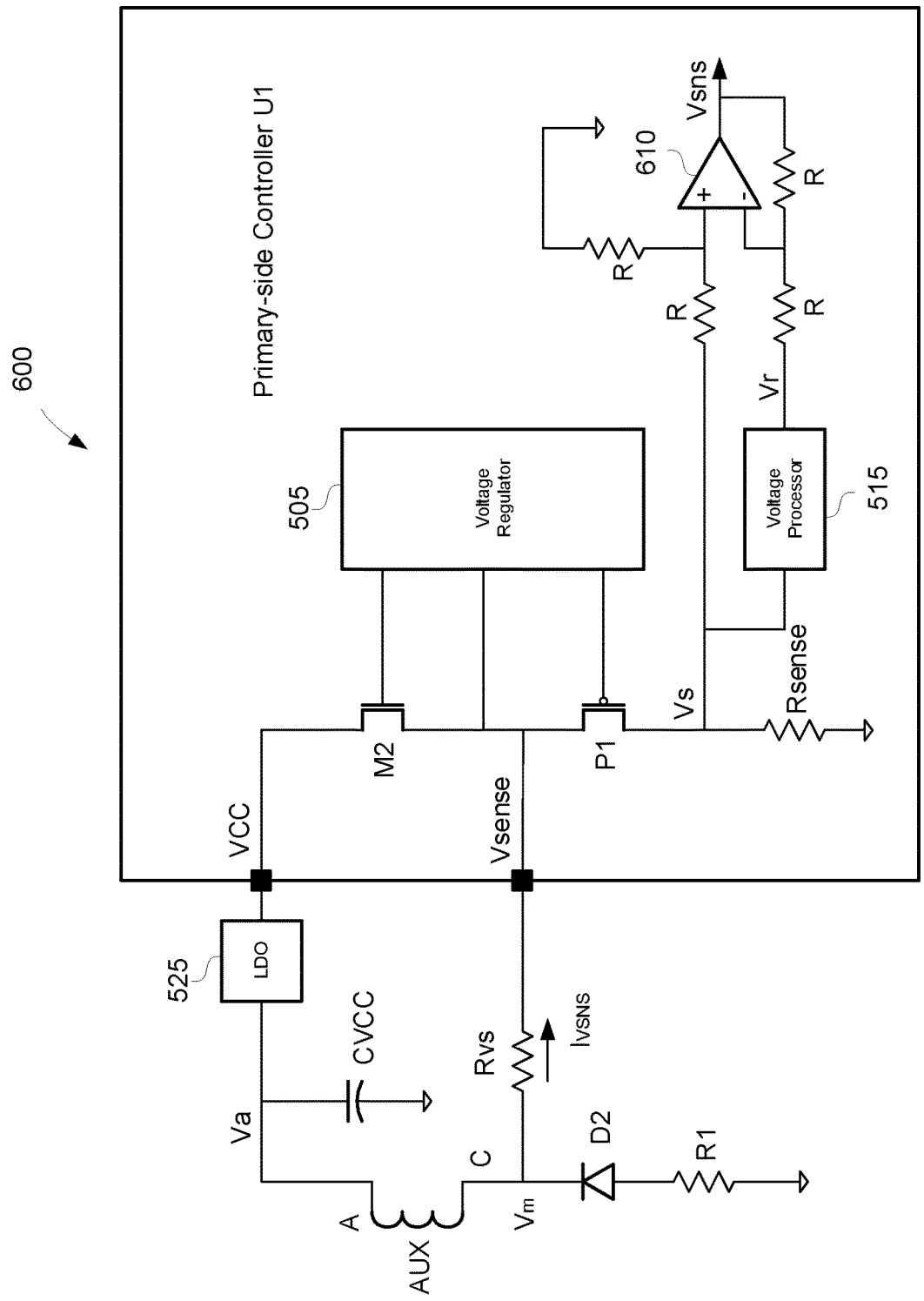
FIG. 6 illustrates the primary-side controller of FIG. 5 in further detail in accordance with an aspect of the disclosure.

A primary-side controller U1 (600) is shown in more detail in FIG. 6 along with its connection to the auxiliary winding. Diode D2, power supply capacitor CVCC, resistor Rvs, and resistor R1 are arranged as discussed for FIGS. 3 and 5. Voltage regulator 505 regulates the Vsense terminal voltage by controlling a gate of an NMOS transistor M2 and a gate of a PMOS transistor P1. The drain of transistor M2 connects to the power rail or node for the power supply voltage VCC and its source connects to a drain of transistor P1. The source of transistor P1 connects to ground through a sense resistor Rsense. The Vsense terminal also connects to the drain of transistor P1 and the source of transistor M2. The input current Ivsns will vary as the voltage Vm varies. As the input current Ivsns falls, the Vsense terminal voltage will tend to fall. To keep the Vsense terminal voltage constant, voltage regulator 505 may then increase the conductance of transistor M2. As the input current Ivsns rises, the Vsense terminal voltage will tend to rise. To again keep the Vsense terminal voltage constant, voltage regulator 505 may increase the conductance of transistor P1. The voltage Vs is developed across the sense resistor Rsense. Voltage generator 510 is thus passive in this embodiment and is formed by sense resistor Rsense. Voltage processor 515 functions as discussed previously to detect the DC offset voltage Vr from the voltage Vs. A differential operational amplifier 610 coupled to a plurality of resistors R functions to amplify the difference (Vs−Vr) to form the sensed voltage Vsns.

Figure 7:
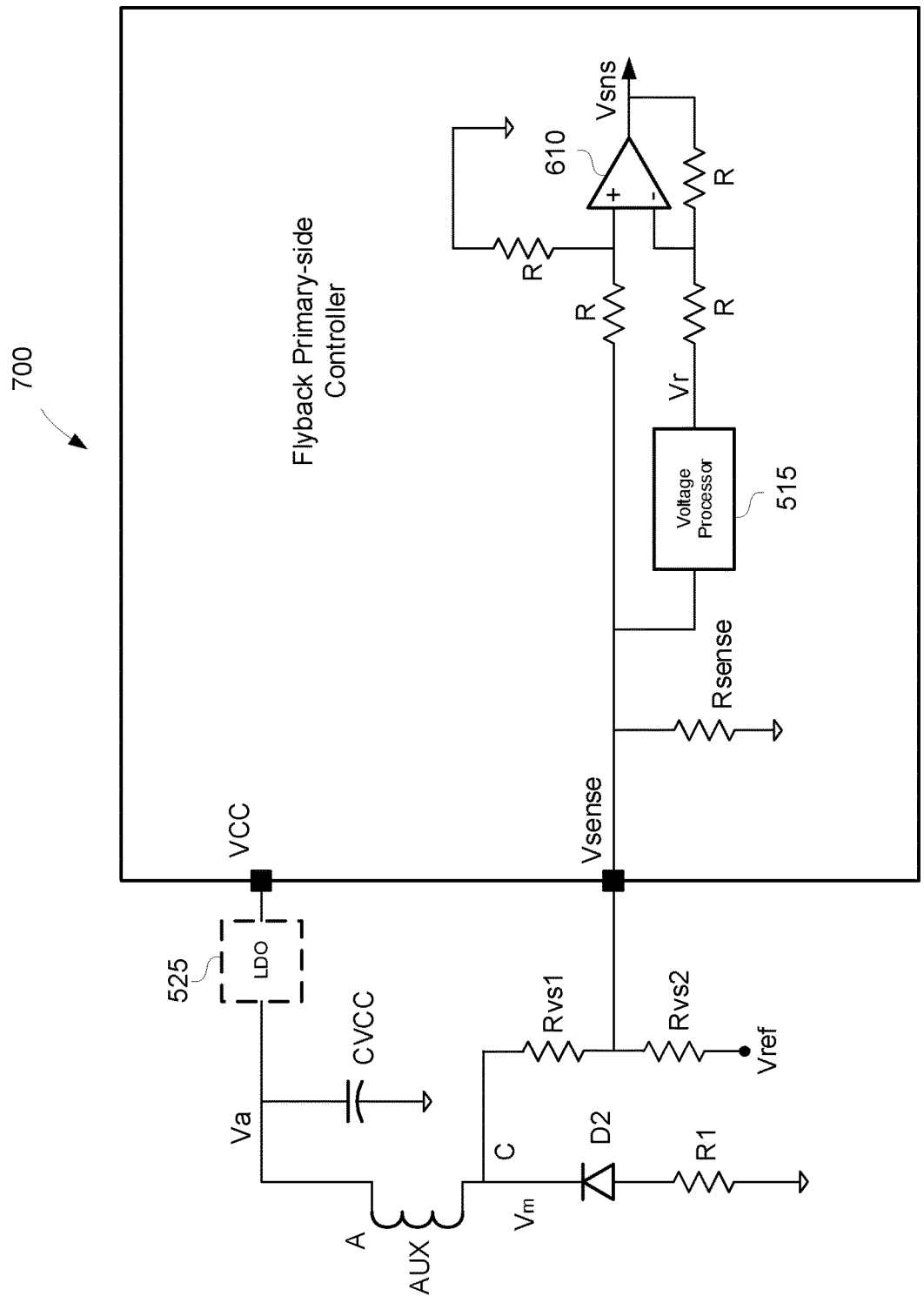
FIG. 7 illustrates an embodiment for the primary-side controller in the flyback converter of FIG. 3 in which the Vsense terminal voltage is not regulated in accordance with an aspect of the disclosure.

In alternate embodiments for the primary-side controller U1, the voltage regulator 505 may be eliminated such that the Vsense terminal voltage is unregulated. An example primary-side controller 700 along with its connections to the auxiliary winding are shown in FIG. 7. Diode D2, capacitor CVCC, and resistor R1 are arranged as discussed for FIGS. 3, 5, and 6. The Vm voltage (the terminal C voltage) of the auxiliary winding is stepped down through a voltage divider such as formed by a resistor Rvs1 and a resistor Rvs2 to drive the Vsense terminal voltage. A terminal of resistor Rvs2 connects to a reference voltage node (Vref) that may be ground in some embodiments. Alternatively, Vref may be a positive (or negative) constant voltage. The sense resistor Rsense couples between the Vsense terminal and ground. The voltage generator 510 in primary-side controller 700 is thus again formed by the sense resistor Rsense. The input current Ivsns develops the voltage Vs across the sense resistor. The voltage processor 515 and differential amplifier 610 are configured as discussed for primary-side controller 600. Regardless of whether the Vsense terminal voltage is regulated or not, note that the improved primary-side controllers disclosed herein have their Vsense terminal coupled to the floating terminal C of the auxiliary winding whereas their VCC terminal is coupled to the power supply voltage (non-floating) terminal A of the auxiliary winding. The resulting sensed voltage thus may be deemed to be referred to the power supply capacitor voltage in that this voltage (the Va voltage) is the DC offset for the terminal C voltage.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A flyback converter, comprising:
a transformer including a primary winding, a secondary winding, and an auxiliary winding, the auxiliary winding having a first terminal and having a second terminal coupled to ground through a diode;
a primary-side controller having a power supply voltage terminal coupled to the first terminal of the auxiliary winding and having a voltage sense terminal coupled to the second terminal of the auxiliary winding, the primary-side controller including:
a voltage regulator configured to regulate the voltage sense terminal to have a constant voltage;
a voltage generator configured to generate a first voltage responsive to an input current received over the voltage sense terminal; and
a voltage processor configured to determine a DC offset voltage of the first voltage.

2. The flyback converter of claim 1, further comprising:
a power switch coupled between ground and a first terminal of the primary winding; and
a synchronous rectifier switch coupled to a first terminal of the secondary winding, the transformer being configured so that the first terminal of the auxiliary winding is homonymous with the first terminal of the primary winding and so that the second terminal of the auxiliary winding is homonymous with the first terminal of the secondary winding.

3. The flyback converter of claim 1, further comprising:
a linear drop out regulator coupled between the first terminal of the auxiliary winding and the voltage sense terminal.

4. The flyback converter of claim 1, further comprising:
a power supply voltage capacitor coupled between the first terminal of the auxiliary winding and ground.

5. The flyback converter of claim 1, further comprising:
a resistor coupled between the second terminal of the auxiliary winding and the voltage sense terminal.

6. The flyback converter of claim 1, wherein a cathode of the diode connects to the second terminal of the auxiliary winding.

7. The flyback converter of claim 6, further comprising:
a resistor coupled between an anode of the diode and ground.

8. The flyback converter of claim 1, wherein the primary-side controller further comprises:
an amplifier configured to amplify a difference between the first voltage and the DC offset voltage to provide a sensed voltage that is proportional to a voltage of the second terminal of the auxiliary winding.

9. A method of operation for a flyback converter, comprising:
through a first terminal of a primary-side controller coupled to a first terminal of an auxiliary winding, receiving a power supply voltage, a voltage of the first terminal of the auxiliary winding equaling the power supply voltage;
through a second terminal of the primary-side controller, sensing a voltage of a second terminal of the auxiliary winding by regulating a voltage of the second terminal of the primary-side controller to equal a constant value, generating a first voltage from an input current received through the second terminal of the primary-side controller, determining a DC offset voltage of the first voltage, and amplifying a difference between the first voltage and the DC offset voltage; the method further comprising:
sensing an input voltage of the flyback converter from the sensing of the voltage of the second terminal of the auxiliary winding.

10. The method of claim 9, further comprising:
sensing an output voltage of the flyback converter from the sensing of the voltage of the second terminal of the auxiliary winding.

11. The method of claim 9, wherein regulating the voltage of the second terminal of the primary-side controller comprises controlling a conductance of a first transistor in series with a second transistor.

12. A primary-side controller for a flyback converter, comprising:
   a power supply voltage terminal configured to receive a power supply voltage from a first terminal of an auxiliary winding;
   a voltage sense terminal configured to receive an input current from a second terminal of the auxiliary winding;
   a voltage generator configured to generate a first voltage from the input current;
   a voltage processor configured to detect a DC offset voltage of the first voltage; and
   an amplifier configured to amplify a difference between the first voltage and the DC offset voltage to produce a sensed voltage that is proportional to a voltage of the second terminal of the auxiliary winding.

13. The primary-side controller of claim 12, further comprising:
   a voltage regulator configured to regulate a voltage of the voltage sense terminal to equal a constant value.

14. The primary-side controller of claim 13, further comprising:
   a first transistor coupled between the power supply voltage terminal and the voltage sense terminal; and
   a second transistor coupled between the voltage sense terminal and ground, wherein the voltage regulator is further configured to regulate the voltage of the voltage sense terminal by controlling a gate voltage of the first transistor and a gate voltage of the second transistor.

15. The primary-side controller of claim 14, wherein the voltage generator comprises a sense resistor, and wherein the second transistor is configured to couple to ground through the sense resistor.

16. The primary-side controller of claim 14, wherein the first transistor is an NMOS transistor and wherein the second transistor is a PMOS transistor.

\* \* \* \* \*